United States Patent [19]

Leitherer

[11] Patent Number: 5,191,335
[45] Date of Patent: Mar. 2, 1993

[54] METHOD AND APPARATUS FOR FLOATING-POINT DATA CONVERSION WITH ANOMALY HANDLING FACILITY

[75] Inventor: Jerald E. Leitherer, Port Ewen, N.Y.

[73] Assignee: International Business Machines Corporation, Armonk, N.Y.

[21] Appl. No.: 612,726

[22] Filed: Nov. 13, 1990

[51] Int. Cl.$^5$ ............................................. H03M 7/24
[52] U.S. Cl. ........................................ 341/94; 341/50
[58] Field of Search ................. 341/94, 50, 75, 104, 341/105, 56; 364/715.03, 715.04, 748, 200, 260.4, 260.9

[56] References Cited

U.S. PATENT DOCUMENTS

| | | |
|---|---|---|
| 3,389,379 | 6/1968 | Erickson et al. |
| 3,872,442 | 3/1975 | Boles et al. ................ 364/715.03 |
| 4,038,538 | 7/1977 | Semmelhaack et al. ........... 341/75 |
| 4,792,793 | 12/1988 | Rawlinson et al. ................ 341/89 |
| 4,831,575 | 5/1989 | Kuroda ............................ 364/748 |

Primary Examiner—Sharon D. Logan
Attorney, Agent, or Firm—Robert L. Troike

[57] ABSTRACT

The anomaly handling facility provides a system for controlling conversion, detecting anomalies, providing analysis of anomaly content in an array of floating-point elements, and preserving reconstruction data to recover value accuracy typically lost when anomalies are encountered during conversion.

Although the preferred embodiment specifically handles anomalies relative to the commonality of value representation by both IBM ESA/370 hexadecimal floating-point notations and ANSI/IEEE 754-1985 binary floating-point stand notations, the systematic design provided by the disclosed floating-point notation conversion anomaly handling facility can be applied to an pair of floating-point notation systems that are not totally coincident in value coverage.

16 Claims, 3 Drawing Sheets

METHOD AND APPARATUS FOR FLOATING-POINT DATA CONVERSION WITH ANOMALY HANDLING FACILITY

BACKGROUND OF THE INVENTION

1. Field of the Invention

The present invention relates to a method and apparatus for conversion of floating-point values between two dissimaler bases or notation systems and handling of conversion anomalies to permit recovery of any lost accuracy.

In recent years, the American National Standards Institute (ANSI) and the Institute of Electrical and Electronic Engineers (IEEE) have provided standards for enhancing and establishing commonality for floating-point notation and processing among the computing industry.

The current engineering/scientific workstation, high-performance mainframe, and supercomputing markets seem to be strongly signalling support of *IEEE Standard for Binary Floating-Point Arithmetic* (ANSI/IEEE 754-1985) as the industry standard for binary floating-point notation and processing.

Recognizing the significance of both the IEEE standard and the IBM hexadecimal formats in heterogeneous cooperative processing, the preferred embodiment offers an application development facility for floating-point interchange to support coexistence and migration between the ANSI/IEEE notation and IBM hexadecimal floating-point notations used by the ESA/370 and ESA/390 processing systems.

Although prior floating-point conversion aids exist, as shown for example, in U.S. Pat. No. 4,792,793 of Rawlinson, etal and U.S. Pat. No. 4,831,575 of Kuroda, there is need for additional facility that provides enhancements for supporting more accurate heterogenous coexistence and cooperative processing among systems using IBM hexadecimal floating-point facilities and systems using ANSI/IEEE 754-1985 binary floating-point facilities, and facility for analyzing accuracy exposure and hence, balancing system accuracy relative to performance among heterogeneous cooperative processing systems.

Although the method and apparatus disclosed relates to any pair of floating-point notation systems that are not totally coincident in value coverage, a brief description of the relationship between an example pair used in one embodiment is useful to contextually demonstrate the field of the invention.

The IBM hexadecimal floating-point (hereinafter referred to as hexadecimal floating-point) short and the ANSI/IEEE 754-1985 binary floating-point (hereinafter referred to as binary floating-point) single are each 32 bits (and both commonly referred to as real *4), but the field formats and the notation semantics are different from one another. The hexadecimal floating-point long and the binary floating-point double are each 64 bits (and both commonly referred to as real *8), but the field formats and notation semantics also are different from one another.

For a more detailed description of each of the formats, refer to *IEEE Standard for Binary Floating-Point Arithmetic* (ANSI/IEEE 754-1985) for binary floating-point and to *IBM Enterprise Systems Architecture/370 Principles of Operation*, SA22-7200, for hexadecimal floating-point.

Although the short and single formats are the same size (32 bits), the field definition is different in size and semantics. The fraction field in both formats may have coincidence in value, but the hexadecimal fraction is actually six sets of four binary digits, hence, the hexadecimal floating-point fraction is multiplied by a power of 16 determined by its characteristic (biased exponent), whereas the binary floating-point fraction is multiplied by a power of 2 determined by its biased exponent.

Furthermore, the normalized hexadecimal floating-point fraction is a number between 0 and 1, whereas the normalized binary floating-point fraction is a number between 1 and 2, and the denormalized binary floating-point fraction is a number between 0 and 1.

Consequently, the binary floating-point format can describe some finer precision numbers than the hexadecimal floating-point format, but the hexadecimal floating-point format can describe a larger range of numbers. The relationship between the short and single formats is illustrated as follows:

s - sign
c - characteristic
f - fraction
hexadecimal floating-point

| s | cccc cccc | f ffff ffff ffff ffff ffff ffff | bits 0 1    7 8 9                              31
| s | eee eeee e | ffff ffff ffff ffff ffff ffff | bits binary floating-point
s - sign
e - biased exponent
f - fraction The range of numbers and the significant fraction bits for each format follows:

|  | Exponent Range | Significand Size | Significant Bits |
|---|---|---|---|
| hexadecimal floating-point | 5.4*10**−79 7.2*10**+75 | 6 hex digits | 21-24 |
| binary floating-point | 1.4*10**−45 3.4*10**+38 | 24 bin digits | 24 |

```
          I----I----I----I----I----0----I----I----I----I
         −80      −40           +40      +80
binary            D..........
hexadecimal       ........................
D-denormalized
```

As with the short/single formats, the field sizes and semantics differ, although each use 64 bits. The fractions differ in the same way as the short/single fractions, but the hexadecimal floating-point binary fractions use more bits, and the biased exponent for the binary floating-point multiplier uses more bits. Consequently, the hexadecimal floating-point format can describe some finer precision numbers, but the binary floating-point format can describe a larger range of numbers. The relationship between the short and single formats is illustrated as follows:

s - sign
c - characteristic
f - fraction
hexadecimal floating-point

-continued

```
 s  ccc cccc  ffff ffff ffff ffff ffff ffff  //  ffff ffff   bits
                                             //
```
```
 0 1      7 11 12                        31      63
 s  eee eeee eeee  ffff ffff ffff ffff ffff   //  ffff ffff   bits
                                              //
``` binary floating-point
s - sign
e - biased exponent
f - fraction

The range of numbers and the significant fraction bits for each format follows:

|  | Exponent Range | Significand Size | Significant Bits |
|---|---|---|---|
| hexadecimal floating-point | $5.4*10^{**}-79$ $7.2*10^{**}+75$ | 14 hex digits | 53-56 |
| binary floating-point | $4.9*10^{**}-324$ $1.8*10^{**}+308$ | 53 bin digits | 24 |

```
I----I----I----I----I----0----I----I----I----I
-300   -150              +150   +300
binary                ......
hexadecimal   D.....................
D-denormalized
```

Because the hexadecimal base numbering is periodically consistent with the binary base numbering system ($2^4=16^1$), the binary exponent and fraction can be adjusted to fit the exponent harmonics between the two notation systems.

Unfortunately, as the fraction is adjusted to accommodate the periodic equivalence for exponents and the restricted fraction field, low-order significance can be lost. Also, because the fraction field of the binary double notation is smaller than the fraction field of the hexadecimal long notation, low-order significance can be lost during conversion. This loss of precision, or units in the last place (ULPs), can occur when converting from short to single (denormalized result), from single to short and from long to double.

When such a loss occurs, the result may be rounded to provide tolerable accuracy, but the need remains for a facility to detect, compensate, evaluate effect, and permit recovery from this precision loss.

The binary floating-point format also includes a representation for infinity and symbolic entities that are not numbers (NaNs) encoded in the floating-point format, but the hexadecimal floating-point notation does not provide for these symbols.

--- binary floating-point single
In-    e=111 1111 1 f=000 0000 0000 0000 0000 0000
finity
NaN   e=111 1111 1 f=nonzero
binary floating-point double
In-    e=111 1111 1111 f=0000 0000 0000 0000 0000 0000 ... 0000
finity
NaN   e=111 1111 1111 f=nonzero

---

For the current invention an anomaly is defined as a floating-point value in a first floating-point notation format that cannot unambiguously, accurately, and completely be represented in the second floating-point notation format. For example, when converting from hexadecimal floating-point short notation format to binary floating-point single notation format, the hexadecimal floating-point values that excede the range of representable binary floating-point values are recognized as anomalies; also, when converting from hexadecimal floating-point long notation format to binary floating-point double notation format, the hexadecimal floating-point values that have finer precision, that is, more significant bits, than can be represented by the binary floating-point notation format are recognized as anomalies; and as further example, when converting from binary floating-point notation formats to hexadecimal floating-point notation formats, the floating-point values previously described as infinity and symbolic entities, which cannot be unambiguously represented by the hexadecimal floating-point notation formats.

Cooperative processing among heterogeneous systems is increasing with the variety of workstation, mainframe, and supercomputing interconnections and ever expanding ways of combining these varied systems to provide entry and display interaction, dynamic visualization of computational processing, large distributed data repositories and data servers for search, retrieval and maintenance, and distributed computational servers to apply greater computational power to problems and reduce elapsed time required to complete problem solutions. The heterogeneous nature of these coupled systems and the asymmetry of the system structure that ensues manifests the need for floating-point data conversion anomaly handling facilities that permit accuracy recovery, accuracy loss analyses, floating-point data characteristic analyses, as well as conversion algorithm selection flexibility.

2. Description of Related Art

U.S. Pat. No. 4,792,793 of Rawlinson, etal provides an example of typical prior art in the field, which provides a means for conversion between one floating-point base and a different floating-point base. In that apparatus coincidence of value coverage is assumed, ignoring possibility for anomalies relative to the conversion algorithm. Coincidence of value coverage is also assumed in U.S. Pat. No. 4,831,575 of Kuroda. U.S. Pat. No. 3,872,442 of Boles, etal provides a means for detecting anomalies during a conversion sequence and selecting a predetermined alternative algorithm for the detected anomalies and producing and indication of unexpected anomalies that are detected during conversion, but it does not provide for recovery of accuracy loss due to the selection of an alternative algorithm nor does it provide accuracy recovery information nor does it provide floating-point data characteristic analysis tabulation.

A search for art related to accuracy recovery facility and characteristic analysis facility for floating-point data conversion among heterogeneous floating-point notation and processing systems has revealed nothing yet in this field.

SUMMARY OF THE INVENTION

The anomaly handling facility provides a system for controlling conversion, detecting anomalies, providing analysis of anomaly content in an array of floating-point elements, and preserving reconstruction data to recover value accuracy typically lost when anomalies are encountered during conversion.

In accordance with the preferred embodiment of the present invention, there is provided means for rounding or constant substitution to provide a reason of accuracy of the conversion and further, means for determining the frequency of rounding or constant substitution action and for recording and tabulating such frequency and further a means for capturing and preserving accuracy recovery and reconstruction data that can be used to recover the lost precision of value in the converted environment.

Although the preferred embodiment specifically handles anomalies relative to the commonality of value representation by both IBM ESA/370 hexadecimal floating-point notations and ANSI/IEEE 754-1985 binary floating-point standard notations, the systematic design provided by the disclosed floating-point notation conversion anomaly handling facility can be applied to an pair of floating-point notation systems that are not totally coincident in value coverage.

BRIEF DESCRIPTION OF DRAWINGS

A detailed description of the present invention is provided along with the accompanying drawings wherein.

DETAILED DESCRIPTION OF THE PREFERRED EMBODIMENT

This floating-point data conversion system converts floating-point data between IBM System/370 and ESA/390 hexadecimal floating-point data formats and ANSI/IEEE 754-1985 binary floating-point data formats and provides additional anomaly handling facility for reprogramming selection rules for selecting conversion algorithms by floating-point value class, reprogramming conversion algorithms for re-programmable algorithm classes, anomaly frequency recording and tabulation, anomaly value accuracy recovery and reconstruction data capturing and preservation, and usage error detection and reporting capabilities. The anomaly handling facilities are key for recovering accuracy that would be lost during conversion. Currently available conversion systems sacrifice accuracy.

Figure 1:
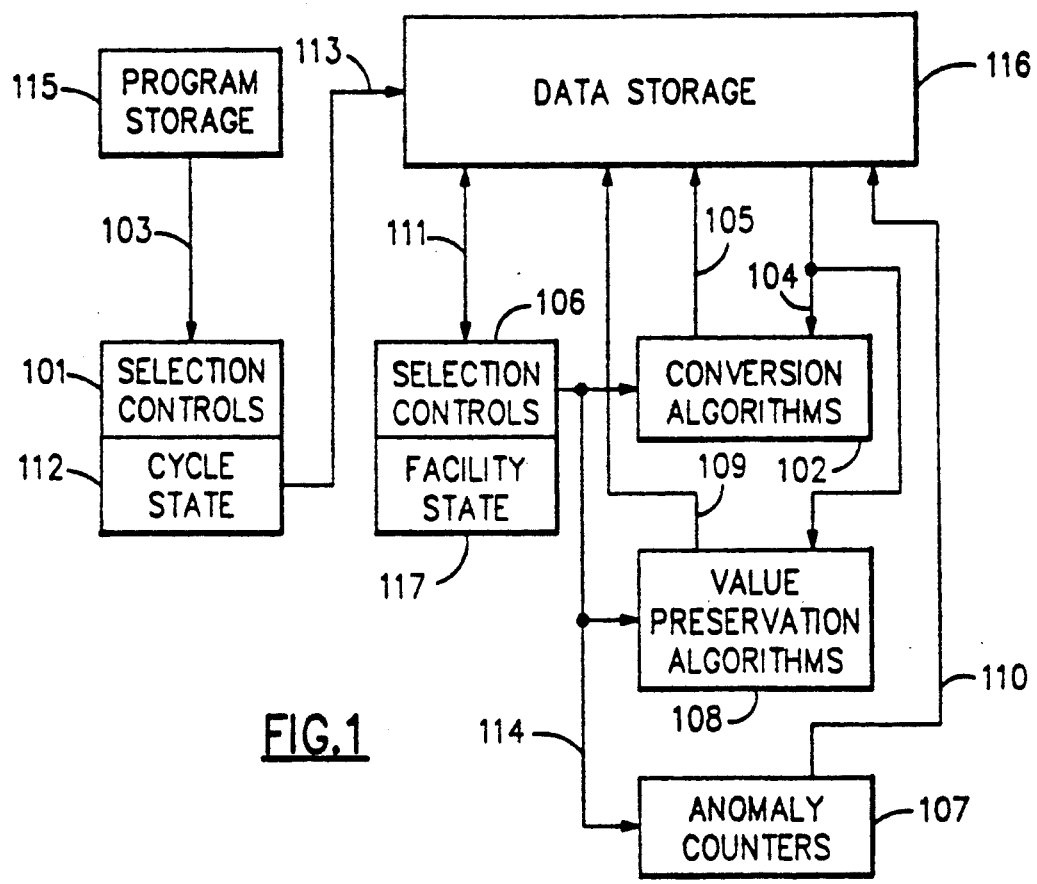
FIG. 1 illustrates an overview summary of the floating-point data conversion and anomaly handling facility.

FIG. 1 presents an overview summary of the floating-point data conversion and anomaly handling facility. In this illustration, the conversion system assumes the availability of some means for program 115 and data storage 116 external to the conversion system but with means for interconnecting and interacting with the conversion system means for sensing external stimuli as described in the subsequent paragraphs and adequate means for sensing, interpreting, capturing, and as necessary preserving conversion system signal presentation, indication, and delivery devices. The anomaly handling facility comprises a set of programmable controls 101 for selecting conversion algorithms, recovery data preservation, floating-point data array analysis, controlling conversion and analysis operation, and indicating status, a set of conversion algorithms 102, a means 103 for stimulating the controls, a means 104 for receiving floating-point values for conversion, a means 105 for delivering converted floating-point values, a means 106 for detecting anomalies, classifying them according to available conversion algorithms and selecting appropriate algorithms, a means 107 for accumulating anomaly quantity tabulation relative to available conversion algorithms, recovery data preservation, and floating-point notation characteristics, a means 108 for capturing and preserving value attributes useful for accurately reconstructing anomaly values with factoring or other recovery techniques appropriate to the converted floating-point notation and processing system, a means 109 for delivering reconstruction data to the data storage 116, a means 110 for delivering anomaly quantity tabulation useful for analyzing floating-point data arrays to the data storage 115, a means 111 for receiving controls for algorithm detection and selection 106 and delivering status information to data storage, a means 112 for cycle repetition, a means 113 for presenting cycle repetition states, which are useful for stepping through storage locations, a path 114 from algorithm selection controls 106 to conversion algorithms 102, value preservation algorithms 108, and counters 107, and a means 117 for determining state of the conversion facility.

FIG. 1 presents an overview schematic of the anomaly handling facility using a program storage as a repository for stimulus and a data storage as a repository for programmable control information, control and operational status indications, floating-point values requiring conversion, converted floating-point values, anomaly quantity tabulation, and recovery reconstruction data.

Figure 2:
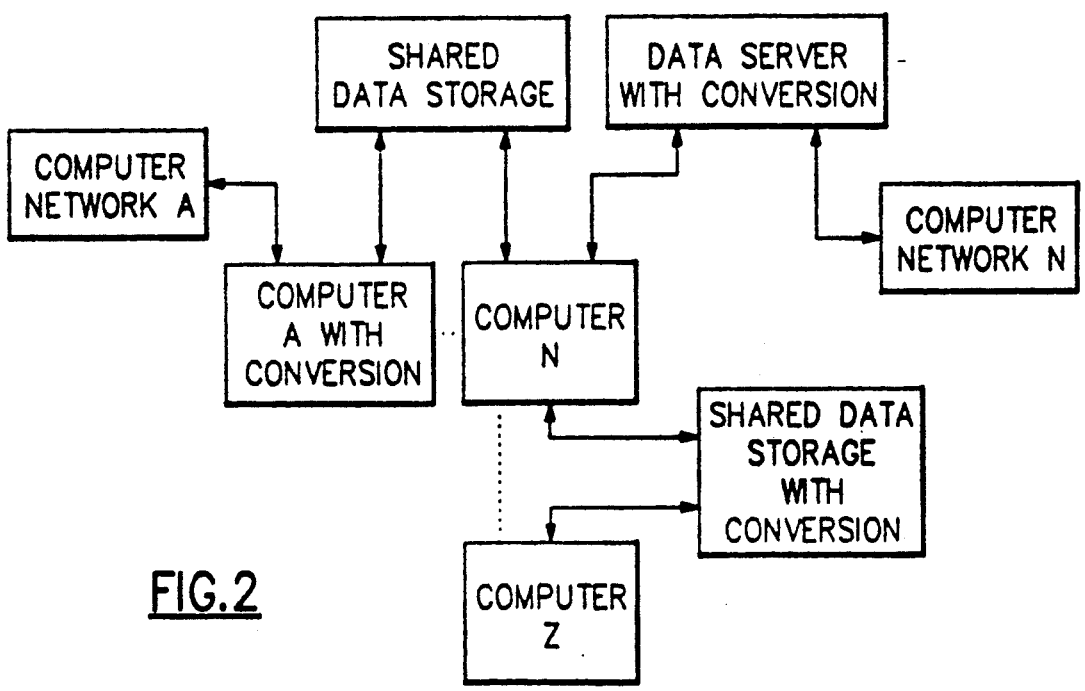
FIG. 2 presents an overview schematic depicting a multiplicity of contextual system environments in which the present invention could be included.

FIG. 2 presents an overview schematic depicting a multiplicity of computing systems coupled by either networks or shared data storage with three variations for including floating-point data conversion systems: one included with a computational server (computer A), one included in the network path (between computational server N and computer network N as a part of a data repository server), and one built into a shared data storage used for memory coupled computational clusters. This environment assumes a variation of floating-point notation systems among the computational engines.

The external stimulus for function selection can be presented with as few as three signals or as many as sixteen signals to select combinations of functions as indicated in the table in Table 1. The stimulus can excite combinations of conversion, rules changes for algorithm selection, preservation of recovery reconstruction data, and quantity analysis tabulation.

In the preferred embodiment, this means is provided by the register 101 or ndx(1), referred to as enhancement control and identified in the on entry definition column of an array of control and status registers illustrated in Table 2.

The value of ndx(1) on entry is the primary control for determining results, selecting counters, and defining the report format desired. Any negative value enables enhanced anomaly handling. Further definition of the anomaly handling is determined by the value of ndx(1) as indicated by Table 1.

TABLE 1

| ndx(1) | Convert | Alt Table | Recon Data | Count |
|---|---|---|---|---|
| ≧0 | yes | no | no | no |
| −1 | yes | yes | yes | yes |
| −2 | no | yes | yes | no** |
| −3 | no | yes | no | yes |
| −4 | yes | yes | no | no |
| −5 | yes | no | yes | yes |
| −6 | no | no | yes | no** |
| −7 | no | no | no | yes |
| −8* | no | *** | no | no |

Note:
*ndx(1) < −8 causes input argument error report
**summary counter ndx(15) is included with recon data
***defaults returned in ndx(21-44)

Figure 5:
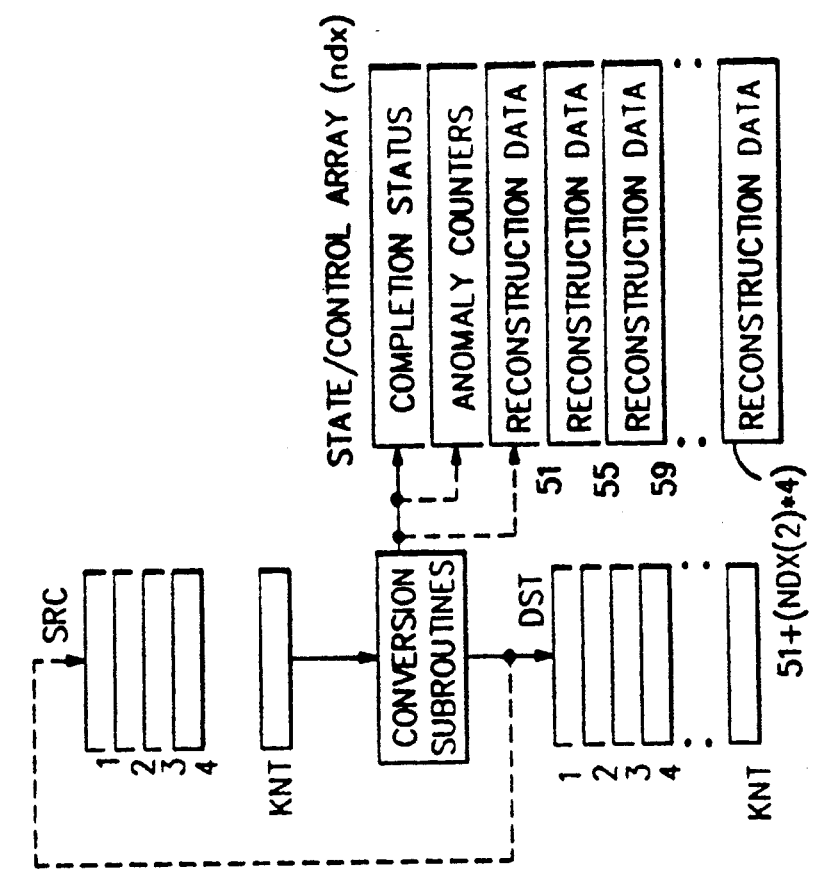
FIG. 5 and Table 2 illustrate flow position and structure of an array of control and status registers.

A state/control array labelled ndx provides both the anomaly handling definition (on entry) and the anomaly report (on return). The state/control array is depicted in the context of the conversion flow in FIG. 5, and Table 2 shows the structure and use of ndx. Note that the element labelled "completion status" is also used for enhancement control on excitation to select the enhancement facilities.

Table 2 describes the structure the array of registers used to present the function selection stimulus, alternate conversion algorithm selection rules, and recovery reconstruction data preservation limit control. These registers are identified by number in the column labeled "Element", and by purpose description in the column labeled "On Entry".

Table 2 also demonstrates how the same set of registers can be used for presenting control and operational status as identified in the column labeled "On Return". Further, as suggested by the register descriptions, these registers can be used to present the anomaly quantity tabulator used for floating-point data array analyses.

TABLE 2

| Element | On Entry | On Return |
|---|---|---|
| 1 | enhancement control | anomaly index or error code |
| 2 | recon data area size | not used |
| 3-15 | not used | counters, see Table 7 |
| 16 | reserved | nin value warning |
| 17 | reserved | nzm value warning |
| 18,19 | reserved | reserved |
| 20 | check code | not used |
| 21-44 | anomaly control table | not used |
| 45-50 | reserved | reserved |
| 51-end | not used | recon data area |
| chk | check code | not used |

Notes:
1. end = 51+(ndx(2)*4)
2. chk = end+1

The required dimension and elements of the ndx array varies according to the enhancement facilities selected. The ndx array dimension and elements required are shown in Table 3.

Note: The excitation may define only the minimum required or it may define more. If more is defined, the facility will ignore the excess.

TABLE 3

| ndx(1) | dimension | elements used |
|---|---|---|
| ≧0 | 1 | 1 |
| −1 | 52+(ndx(2)*4) | all |
| −2 | 52+(ndx(2)*4) | all except 3-14 |
| −3 | 44 | 1, 3-44 |
| −4 | 44 | 1, 16-44 |
| −5 | 52+(ndx(2)*4) | all except 16,17,and 21-44 |

TABLE 3-continued

| ndx(1) | dimension | elements used |
|---|---|---|
| −6 | 52+(ndx(2)*4) | 1, 2, 15, 18-20, 50-chk |
| −7 | 20 | 1, 3-15, 18-20 |
| −8 | 44 | 1, 18-20, 21-44 |

Additional external stimulus can be presented with at least one signal to begin the system operation cycle and provide cycle repetition control. In the preferred embodiment, a CALL signal is presented with a 32-bit register 112 labeled knt, whose contents are interpreted as a binary integer, to provide cycle repetition control and deliver such cycle repetition state via 113.

To provide optional definition for handling anomalies, a conceptual model of the value ranges is defined and rules for conversion and reporting are prescribed in the context of that model.

Figure 3:
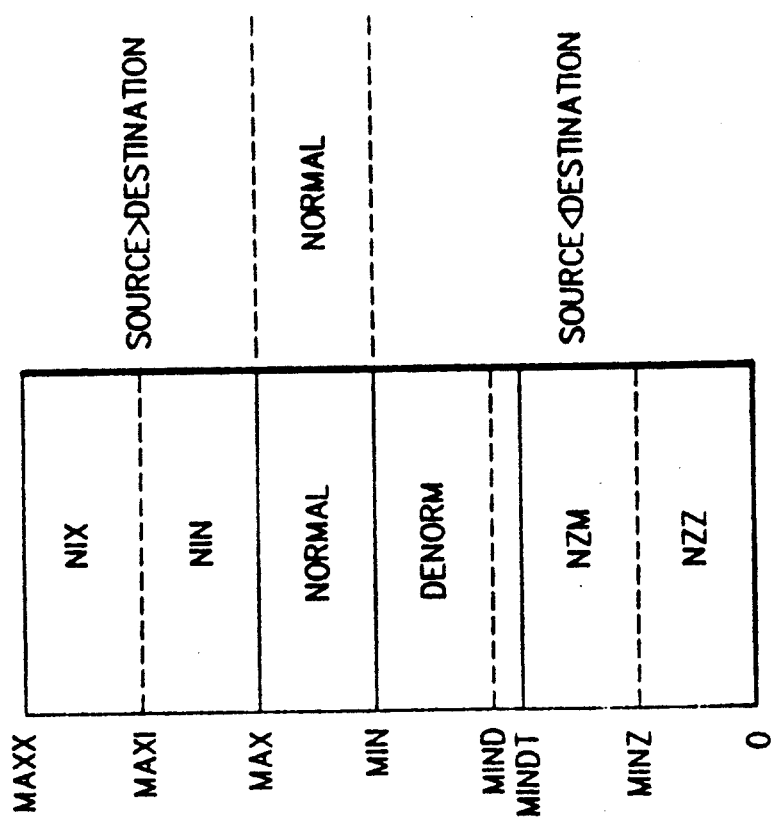
FIG. 3 depicts a model for classifying conversion algorithm ranges by floating-point value.

In the model, the absolute value range for floating-point number representation is divided into three categories relative to the range of absolute values that can be represented by both notation schemes.
1. source > destination
2. normal
3. source < destination Although zero provides a boundary, it is excluded from all categories because it has the same semantics for both notation schemes. This model is depicted in FIG. 3.

The normal category includes absolute numeric values that can be represented in both notation schemes, ignoring precision of the ULPs of the fraction, as normalized values. A normalized floating-point number has a nonzero leftmost hexadecimal fraction digit for hexadecimal floating-point and a nonzero leftmost fraction bit for binary floating-point. For reference, the lower bound of this category is defined by min and the upper bound is defined by max.

The source > destination category includes values that are excessive in absolute value relative to the largest number in the normal category including values that are not considered as numbers (NaN's) and other values that are not representable in the destination form (infinity). The upper bound of this category is defined by maxx, which is a value composed of all bits equal to one, ignoring the sign bit.

The source > destination category includes values that are diminutive in absolute value relative to the smallest number in the normal category, except zero. However, the lower bound of this category is defined by zero.

As shown in FIG. 3, both the source > destination and the source < destination categories are further divided into more definitive parts. The division point for source > destination is defined by maxi and the two divisions for source < destination are defined by mind and minz. Additionally, mindt defines the diminutive boundary extension limit for mind values.

Conversion rules are then identified by the following terms, which can be prescribed by values in the ndx (21-44) subarray, with each CALL, or by the BLOCK DATA array initialization established during load of the application program.

Boundary terms are values in source notation and result terms are values in destination notation.

nix to define the result of action required to produce the result when the source number is maxx or lies between maxi and maxx, except when binary source is NaN or infinity and except when hexadecimal source is unnormalized.

maxi to define the lower boundary for nix and the upper boundary for nin. This is a flexible boundary that can be varied with the CALL parameter.

nin to define the result for numbers that equal maxi or lie between max and maxi, except when hexadecimal source is unnormalized.

mind to define the diminutive boundary extension allowed for denormalized destination values. This is a flexible boundary that can be varied with the CALL parameter.

nzm to define the result or action for source numbers that equal minz or lie between min and minz, except when hexadecimal source is unnormalized.

minz to define the lower boundary for nzm and the upper boundary for nzz. This is a flexible boundary that can be varied with the CALL parameter.

nzz to define the result or action for source numbers that lie between zero and minz, except when hexadecimal source is unnormalized.

inf to define the result for infinity source nan to define the result for NaN source nanu to define the result for unnormalized hexadecimal source. If one or more leftmost fraction digits are zeros, the number is said to be unnormalized.

nrd to indicate whether inexact due to loss of precision should be counted as an anomaly. 0=result is rounded toward zero, not recognized as anomaly; 1=result is rounded toward zero, counted as anomaly, included with report; 0>nrd>1, invalid.

Figure 4:
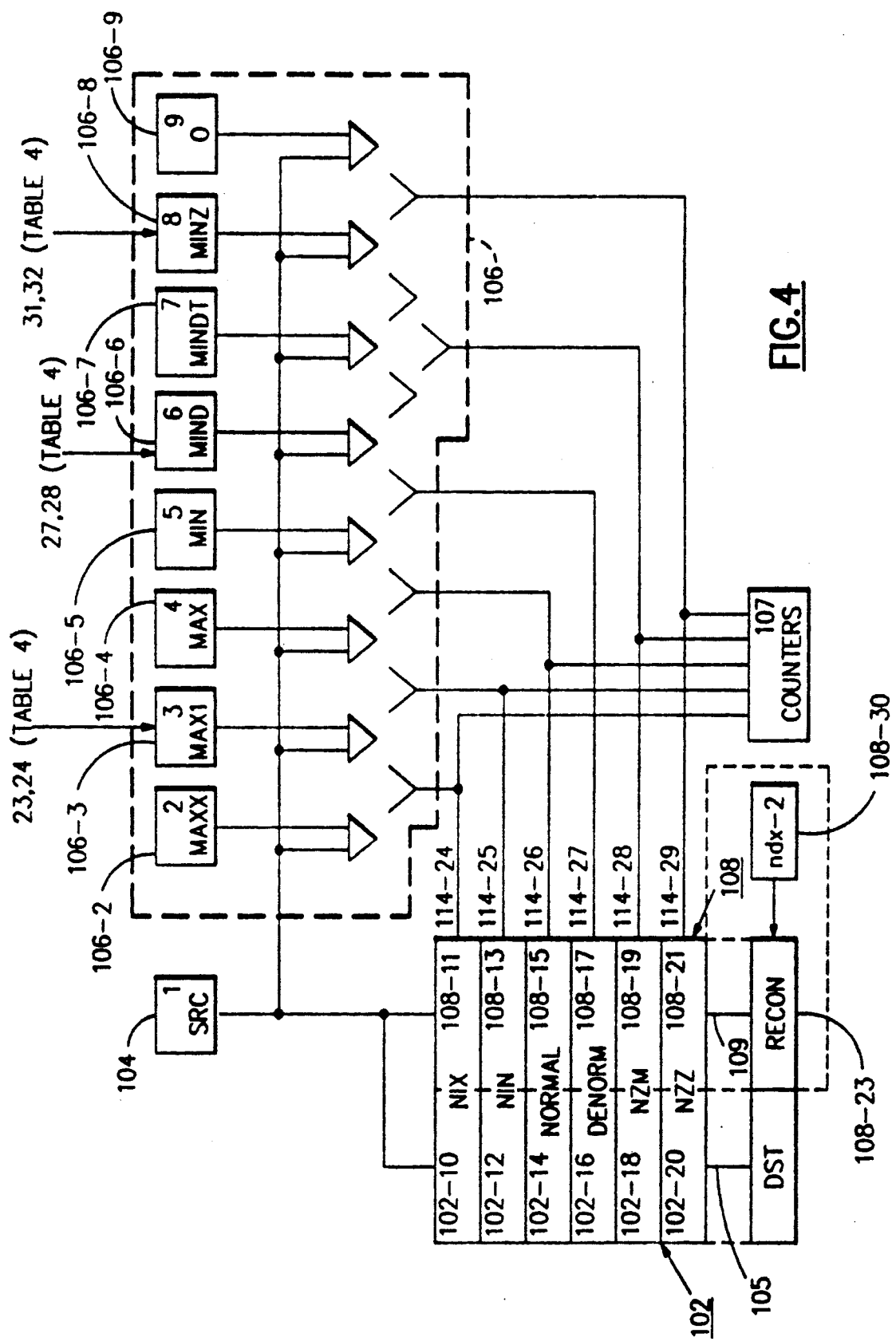
FIG. 4 and accompanying textual description shows how the floating-point value requiring conversion can be compared with the rules for classification (maxx, maxi, max, min, mind, mindt, minz, and 0) to select conversion algorithms and recovery reconstruction data preservation algorithms.

Applying the model, the range categories identify a set of nine conversion algorithms grouped into six classes for selection during the conversion cycle. FIG. 4 shows how the floating-point value requiring conversion can be compared with the rules for classification (maxx, maxi, max, min, mind, mindt, minz, and 0) to provide the means 106 to select conversion algorithms and recovery reconstruction data preservation algorithms. Referring to FIG. 4, data received via 104 is converted to provide a result in register 102-22 in the target format. The algorithm used to produce the result in register 102-22 is determined by comparisons among registers 106-1 through 106-9 in set as illustrated and identified by selection lines 114-24 through 114-29. Lines 114-24 through 114-29 also feed the anomaly counters 107. Additionally, accuracy recovery and reconstruction data is produced in register array 108-23 in parallel with that produced for delivery via 105. In the preferred embodiment, the algorithm used to produce the recovery and reconstruction data is selected by the same comparisons used to select the algorithm for producing the result for delivery via 105, however, a separate and similar algorithm selection control could be used to provide greater flexibility.

As illustrated in FIG. 4, algorithms are paired in six sets: 1) 102-10, 108-11 (nix); 2) 102-12, 108-13 (nin); 3) 102-14, 108-15 (normal); 4) 102-16, 108-17 (denorm); 5) 102-18, 108-19 (nzm); 6) 102-20, 108-21 (nzz). In the preferred embodiment, algorithms for sets 1, 2, 5, and 6 can be dynamically programmed and comparands in registers 106-3, 106-6, and 106-8 can be dynamically programmed, whereas algorithms for set 3 and 4 are fixed in the design as are constant comparand registers 106-2, 106-4, 106-5, 106-7, and 106-9. However, variations of fixed and programmable registers might prove useful for alternate embodiments in certain environments.

Referring again to Table 2 for context, Table 4 further describes the same register set identified as the anomaly control table, which can be programmed during the excitation but prior to the conversion algorithm selection cycle period. In FIG. 3, the dashed lines labeled maxi, mind, and minz are programmable, while the solid lines are fixed boundaries, which is not restrictive by the design, but rather representative of the preferred embodiment. The same classes and comparisons are used to select the algorithm for preserving recovery reconstruction data to make it easy to use for the converted environment.

TABLE 4

| ndx(n) | bytes 0-3 | bytes 4-7 | type of term |
|---|---|---|---|
| 21,22 | nix 0-3 | nix 4-7 | result (destination) |
| 23,24 | maxi 0-3 | maxi 4-7 | boundary (source) |
| 25,26 | nin 0-3 | nin 4-7 | result (destination) |
| 27,28 | mind 0-3 | mind 4-7 | boundary (source) |
| 29,30 | nzm 0-3 | nzm 4-7 | result (destination) |
| 31,32 | minz 0-3 | minz 4-7 | boundary (source) |
| 33,34 | nzz 0-3 | nzz 4-7 | result (destination) |
| 35,36 | inf 0-3 | inf 4-7 | result (destination) |
| 37,38 | nan 0-3 | nan 4-7 | result (destination) |
| 39,40 | reserved | reserved | na |
| 41,42 | nanu 0-3 | nanu 4-7 | result (destination) |
| 43,44 | nrd | check code | na |

Note:
32-bit conversions do not use bytes 4-7, but the area is reserved.
maxx, max, min, and mindt cannot be redefined.
all values are absolute values, hence the sign bit is ignored.

The optional reporting facility can aid in attaining accuracy when using converted data. The report provides the following anomaly information:
quantity
index
reconstruction data.

The anomaly quantity report provides several counters to permit analyzing the types of anomalies encountered. The anomaly index provides a reference to locate an anomaly within an array of converted elements. And, the anomaly reconstruction data provides adequate information to reconstruct the source value in the destination environment.

To permit performance-oriented trade-off, on entry to the subroutine, the call parameters can prescribe limited reporting. The least report is a single index of the last anomaly encountered.

The reconstruction data is provided in the context of the destination environment. That is, when hexadecimal floating-point is converted to binary floating-point, the reconstruction data is presented in a binary floating-point form, and when binary floating-point is converted to hexadecimal floating-point, the reconstruction data is presented in an hexadecimal floating-point form. For each form, the representation has three components plus an anomaly code and index to locate it relative to the context of the converted array.

The three components of the reconstruction data are: an unbiased exponent, a sign for the composite value, and a significand. The format of the reconstruction data follows:

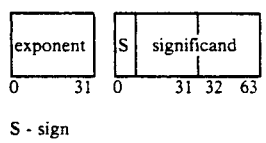

S - sign ndx(2) reconstruction data area size—on entry

The value of 108-30 ndx(2) on entry indicates the maximum quantity of anomaly reconstruction entries allowed. When the limit is reached, the entry of each additional anomaly encountered is written over the last entry. Hence, the first n anomaly reconstruction entries can be recorded, where n=ndx(2).

Note: The value of ndx(2) determines the location of end and chk to validate the anomaly reconstruction data area.

Table 5 depicts a structure of registers for capturing anomaly recovery reconstruction data. This data is further described for the preferred embodiment in FIG. 7 and the textual description following the heading "Reconstruction Data".

ndx(51-end) reconstruction data—on return

Anomaly reconstruction data is reported in theregister array 108-23 ndx(51-end). Each entry contains the anomaly index and the reconstruction data. When the reconstruction report is selected, ndx must be defined as an array with a dimension equal to 52+(ndx(2)*4).

TABLE 5

| ndx(51+n) | ndx(52+n) | ndx(53+n) | ndx(54+n) |
|---|---|---|---|
| anomaly code, index | unbiased exponent | sign, significand 1-31 | significand 32-63 |

Note:
n may equal 0 to ndx(2)*4 in increments of 4

Each anomaly index is a single integer whose value can be used as an index into the source or result array to select the element that was treated as an anomaly.

The reconstruction data for each anomaly encountered provides an encoded representation that identifies the anomaly and permits reconstruction of the source value in the destination environment. The more likely uses will be:

to develop scaling factors for processing out of range anomalies by factoring the reconstruction data and using the factors for scaling during subsequent processing, for example:

| | |
|---|---|
| if exponent | $n = 128 + (n-128)$ |
| fraction | $f = f$ |
| then real*4 | $a = 2^{n}*f$ |
| or real*4 | $a = 2^{128}*2^{(n-128)}*f$ | thus, the reconstruction data fraction can be used with a factor of the reconstruction data exponent to form a real *4 or a real *8 value that can be used with a second factor formed by the remaining exponent factor and a simulated fraction that forms a mantissa of one.

to redevelop the value in a larger precision format, for example:
 ULPs lost from a value when HS2BS results in a denormalized value can be recovered by adding the binary double bias to the reconstruction data exponent, shifting it left into bits 1-11, and ANDing it with the high-order word (0-31) of the reconstruction data fraction; then load this value into a real *8 variable for processing a similar technique may be used for recovering ULPs lost during BS2HS conversions, that is, the converted value may be loaded into a real *8 variable that has equivalence as an integer *4(2) variable, and the low-order word (32-63) of the reconstruction data fraction can be ANDed into the second integer *4 element to provide the lost value no standard larger precision format is defined for recovering ULPs lost during HL2BD conversions, so the fraction has been adjusted to begin with bit 1 and a similar procedure may be used to align it to fit any supported format.

NaNs may be recognized as operand initialization requirements and appropriate preprocessing done prior to using the values.

When the anomaly reconstruction data is included in the report, associated with each anomaly code and index entry is a three-component reconstruction value, including:

1. unbiased exponent
2. sign for composite value
3. significand

This information will be adequate to completely reconstruct the source value in the destination environment. The format of the three-component reconstruction value was previously described.

The first component, the unbiased exponent, is an integer *4 containing the value of the exponent for the destination environment if the destination environment's exponent were expanded to an integer *4. That is, when hexadecimal floating-point is converted to binary floating-point, the unbiased exponent is an unbiased binary floating-point, the unbiased exponent is an unbiased hexadecimal floating-point exponent.

The second component, the sign of the composite value is the high-order bit of the significand.

The third component, the significand is equivalent to a real *8 value that can be multiplied by the unbiased exponent to accurately produce the source value. However, for the binary floating-point values, the high-order bit (bit 8) is the bit to the left of the radix point and for the hexadecimal floating-point values, the high-order digit (bits 8-11) is the digit to the right of the radix point.

Additionally, to make these values easier to reconstruct for processing, the significand is aligned to the most likely destination format to be used for value recovery and processing. For example, significands preserved to recover lost ULPs during HS2BS conversion are aligned with the high-order bit in bit position 12 to permit easy formation of binary double numbers. Similarly, values preserved for recovery from lost ULPs during BS2HS conversions are aligned with the high-order bit in bit position 8 to permit easy formation of hexadecimal long numbers.

The anomaly code, stuffed into the high-order digit of the index, is an encoded classification of the anomaly represented by this entry. Table 6 describes the encoded classifications.

TABLE 6

| Anomaly code | ndx(3-15) counter | ndx(21-44) entry | Description |
|---|---|---|---|
| 3 | 3,5 | nix | Undesirable source — beyond range |
| 5 | 5* | nin | Inexact — beyond range near max |
| 7 | 7* | nzm | Inexact — beyond range near min |
| 9 | 7,9 | nzz | Inexact — beyond range near zero |
| A | 5,10 | inf | Infinity — ** |
| B | 5,11* | nan | NaN — ,* |
| D | 13 | nanu | Unnormalized source — *** |
| E | 14 | nrd | Inexact — lost precision |

Note:
All anomalies increment counter 15
*summary counter, see Table 7
**unbiased exponent invalid
***significand contains significant bits unmodified ndx(3-14) anomaly counters—on return The anomaly counters 107 are accumulated in the ndx(3-15) register array, as cited in Table 2, using the assignments defined in Table 7. The four columns in the right portion of the table refer to the embodiment conversion descriptions that follows. The anomaly count is an integer whose value indicates the quantity of anomalies encountered during each call of the subroutine. The value is reset to zero when the subroutine is called and increased by one for each anomaly encountered. Table 1 indicates how ndx(1) enables the counters.

TABLE 7

| ndx(n) | Definition | H2BS | H2BL | B2HS | B2HD |
|---|---|---|---|---|---|
| 3 | inexact results due to excessive source > maxi(nix) | x | x |  | x |
| 4 | summary of source characteristic/exponent = all ones | x | x | x | x |
| 5 | summary of inexact results due to excessive source (nin, nix., inf, nan, nans) | x | x | x | x |
| 7 | summary of inexact results due to diminutive source (nzm, nzz) | x | x | x | x |
| 9 | inexact results due to diminutive source < minz (nzz) | x | x |  | x |
| 10 | source is infinity (inf) |  |  | x | x |
| 11 | summary of source NaN's (nan) |  |  | x | x |
| 13 | source unnormalized (nanu) | x | x |  |  |
| 14 | inexact results due to lost fraction ULPs (nrd) | x | x | x |  |
| 15 | summary of all anomalies (inexact results) | x | x | x | x |

On completion of cycle-repetition sequences, all anomaly reports can be observed in the ndx array.

ndx(1) anomaly index or input error code—on return

The value representing conversion facility state 117 returned in ndx(1) is an index that identifies the last anomaly encountered. The index is relative to the first element of the source variable. When no anomalies are encountered, ndx(1) remains unchanged.

Note: The index of the last anomaly encountered is reported for all ndx(1) functions except −8 (return default ACT).

When invalid excitation is detected, no conversion occurs and ndx(1) indicates the invalidity as follows:
−2 ndx(2)≦0
−9 ndx(1)<−8
−10 knt≦0
−20 ndx(20)≠check code
−23 maxx=ndx(23) or ndx(23)≦max
−27 min<ndx(27) or ndx(27)<mindt
−31 ndx(27)≦ndx(31) or ndx(31)≦0
−43 1<ndx(43) or ndx(43)<0
−44 ndx(44)≠check code
−51 ndx(chk)≠check code, Table 8 indicates the order in which arguments are examined for errors.

TABLE 8

| ≧0 | −1 | −2 | −3 | −4 | −5 | −6 | −7 | −8 |
|---|---|---|---|---|---|---|---|---|
| −10 | −9 | −9 | −9 | −9 | −9 | −9 | −9 | −9 |
|  | −20 | −20 | −20 | −20 | −20 | −20 | −20 | −20 |
|  | −10 | −10 | −10 | −10 | −10 | −10 | −10 |  |
|  | −44 | −44 | −44 | −44 | −2 | −2 |  |  |
|  | −31 | −31 | −31 | −31 | −51 | −51 |  |  |
|  | −27 | −27 | −27 | −27 |  |  |  |  |
|  | −23 | −23 | −23 | −23 |  |  |  |  |
|  | −43 | −43 | −43 | −43 |  |  |  |  |
|  | −2 | −2 |  |  |  |  |  |  |
|  | −51 | −51 |  |  |  |  |  |  |

Table 9 shows the relationship between selected functions and input argument errors.

TABLE 9

| function | input argument error value on return ||||||||| 
|---|---|---|---|---|---|---|---|---|---|
|  | ≧0 | −1 | −2 | −3 | −4 | −5 | −6 | −7 | −8 |
| conversion | −10 | −10 | −10 | −10 | −10 | −10 | −10 | −10 | −10 |
| enhancements |  | −9 | −9 | −9 | −9 | −9 | −9 | −9 | −9 |
|  |  | −20 | −20 | −20 | −20 | −20 | −20 | −20 | −20 |
| alternate ACT |  | −23 | −23 | −23 | −23 |  |  |  |  |
|  |  | −27 | −27 | −27 | −27 |  |  |  |  |
|  |  | −31 | −31 | −31 | −31 |  |  |  |  |
|  |  | −43 | −43 | −43 | −43 |  |  |  |  |
|  |  | −44 | −44 | −44 | −44 |  |  |  |  |
| reconstruction data |  | −2 | −2 |  |  | −2 | −2 |  |  |
|  |  | −51 | −51 |  |  | −51 | −51 |  |  |

Note: Remember that some input argument values affect others. For example, ndx(27) and ndx(31), in this case, although ndx(27) may be the only value redefined, it could cause ndx(1), to be set to −31 if the ndx(27) value were less than or equal to the ndx(31) value.

The following conversion descriptions show how four embodiments of the present invention can provide conversion and anomaly handling flexibility for the four conversion cases of the preferred embodiment by showing a comparison of the two floating-point notation formats and the conversion algorithm used for the normal range (between max and min) values, the substitution algorithms used for the other classes, the registers that can define alternate algorithm selection rules and the range of values that can be provided for the substitution algorithms, and the anomalies detected and tabulated for analysis for each of the conversions provided by the preferred embodiment.

HEXADECIMAL FLOATING-POINT TO BINARY FLOATING-POINT

Short/Single

HS2BS provides identity and reference to previous counter descriptions

Convert hexadecimal short formal real*4 numbers into binary single format real*4 numbers.

TABLE 4

| ndx(n) | bytes 0-3 | bytes 4-7 | type of term |
|--------|-----------|-----------|--------------|
| 21,22  | nix 0-3   | nix 4-7   | result (destination) |
| 23,24  | maxi 0-3  | maxi 4-7  | boundary (source) |
| 25,26  | nin 0-3   | nin 4-7   | result (destination) |
| 27,28  | mind 0-3  | mind 4-7  | boundary (source) |
| 29,30  | nzm 0-3   | nzm 4-7   | result (destination) |
| 31,32  | minz 0-3  | minz 4-7  | boundary (source) |
| 33,34  | nzz 0-3   | nzz 4-7   | result (destination) |
| 35,36  | inf 0-3   | inf 4-7   | result (destination) |
| 37,38  | nan 0-3   | nan 4-7   | result (destination) |
| 39,40  | reserved  | reserved  | na |
| 41,42  | nanu 0-3  | nanu 4-7  | result (destination) |
| 43,44  | nrd       | check code | na |

Note:
32-bit conversions do not use bytes 4-7, but the area is reserved.
*maxx, max, min,* and *mindt* cannot be redefined
all values are absolute values, hence the sign bit is ignored.

Normal range algorithm

| binary floating-point | |
|---|---|
| f: | f(bin) = f(hex)*J1 |
| e: | e(bin) = 4*(c(hex)-64) + J2 + 126 |
|    | = 4*c(hex) + J2 − 130 |
| s: | Sign (bin) = Sign(hex) |

Where J1 and J2 are both a function of the 4 leftmost bits of hex fraction.
c-characteristic
e-biased exponent
f-fraction
s-sign Note: No precision is lost when source numbers are in normal range. Denorm range algorithm

| binary floating-point | |
|---|---|
| f: | f(bin) = f(hex)*J1/2**(131−C+J2) |
| e: | e(bin) = 0 |
| s: | s(bin) = s(hex) |

Where J1 and J2 are both a function of the 4 leftmost bits of hex fraction.
c-characteristic
e-biased exponent
f-fraction
s-sign Note: A loss of precision can occur if the least significant bits of the fraction are nonzero.

TABLE 10

| model | source default | destination default | ndx (21-44) | ndx (21-44) limits* |
|-------|----------------|---------------------|-------------|---------------------|
| maxx  | 7FFF FFFF      | 7F80 FE00           |             | na                  |
| nix   | maxi<s≦maxx    | 7F80 FE00           | 21          | 7FFF FFFF           |
|       |                |                     |             | —                   |
|       |                |                     |             | 0000 0000           |
| maxi  | 7FFF FFFE      | 7F80 0000           | 23          | max<maxi<maxx       |
| nin   | max<s≦maxi     | 7F80 0000           | 25          | 7FFF FFFF           |
|       |                |                     |             | —                   |
|       |                |                     |             | 0000 0000**         |
| max   | 60FF FFFF      | 7F7F FFFF           |             | na                  |
| normal| 60FF FFFF      | 7F7F FFFF           |             | na                  |
|       | —              | —                   |             |                     |
|       | 2140 0000      | 0080 0000           |             |                     |
| min   | 2140 0000      | 0080 0000           |             | na                  |
| denorm| 213F FFFF      |                     | na          | mind≦denorm≦min     |
|       | —              |                     |             |                     |
|       | 1B80 0000      |                     |             |                     |
| mind  | 1B80 0000      | 0000 0001           | 27          | mindt≦mind≦min      |
| mindt | 1B80 0000      | 0000 0001           |             | na                  |
| nzm   | minz≦s≦mind    | 0000 0000           | 29          | 7FFF FFFF**         |
|       |                |                     |             | 0000 0000           |
| minz  | 0010 0000      | 0000 0000           | 31          | 0<minz<mind         |
| nzz   | 0<s<minz       | 0000 0000           | 33          | 7FFF FFFF           |
|       |                |                     |             | —                   |
|       |                |                     |             | 0000 0000           |
| ±0    | 0000 0000      | 0000 0000           |             | na                  |
|       | 8000 0000      | 8000 0000           |             |                     |
| inf   | na             | 0000 0000           | 35          | na                  |
| nan   | na             | 0000 0000           | 37          | na                  |
| nanu  | unnormalized   | 0000 0000           | 41          | 7FFF FFFF           |
|       |                |                     |             | —                   |
|       |                |                     |             | 0000 0000           |
| nrd   |                |                     | 43          | 0000 0001           |
|       |                |                     |             | —                   |
|       |                |                     |             | 0000 0000           |

Note:
*na - not available for alternate definition
**warnings provided if *nin* < *max* and if *nzm* > *min*

TABLE 11

| model | source default | destination default | code A1 | ndx (3-15) counters* |
|-------|----------------|---------------------|---------|----------------------|
| maxx | 7FFF FFFF | 7F80 FE00 | 3 | 3,5 |
| nix | $maxi < s \leq maxx$ | 7F80 FE00 | 3 | 3,5 |
| maxi | 7FFF FFFE | 7F80 0000 | 5 | 5 |
| nin | $max < s \leq maxi$ | 7F80 0000 | 5 | 5 |
| max | 60FF FFFF | 7F7F FFFF | | |
| normal | 60FF FFFF | 7F7F FFFF | | |
| | — | — | | |
| | 2140 0000 | 0080 0000 | | |
| min | 2140 0000 | 0080 0000 | | |
| denorm | 213F FFFF | | E** | 14** |
| | — | — | | |
| | 1B80 0000 | | | |
| mind | 1B80 0000 | 0000 0001 | E** | 14** |
| mindt | 1B80 0000 | 0000 0001 | E** | 14** |
| nzm | $minz \leq s < mind$ | 0000 0000 | 7 | 7 |
| minz | 0010 0000 | 0000 0000 | 7 | 7 |
| nzz | $0 < s < minz$ | 0000 0000 | 9 | 7,9 |
| ±0 | 0000 0000 | 0000 0000 | | |
| | 8000 0000 | 8000 0000 | | |
| nanu | unnormalized | 0000 0000 | D | 13 |
| | characteristic = ones | | | 4 |

Note:
*all anomalies increment counter 15
**lost fraction bits (not recognized when $ndx(43)=0$)

When input argument errors are detected, no conversion occurs and ndx(1) is set to indicate one of the input argument error codes as follows:

−2 $ndx(2) \leq 0$
−9 $ndx(1) < −8$
−10 $knt \leq 0$
−20 $ndx(20) \neq$ check code
−23 $maxx = ndx(23)$ or $ndx(23) \leq max$
−27 $min < ndx(27)$ or $ndx(27) < mindt$
−31 $ndx(27) \leq ndx(31)$ or $ndx(31) \leq 0$
−43 $1 < ndx(43)$ or $ndx(43) < 0$
−44 $ndx(44) \neq$ check code
−51 $ndx(chk) \neq$ check code,

Long/Double

HL2BD provides identity for crossreference
Convert hexadecimal long format real*8 numbers into binary double format real*8 numbers.

s - sign
c - characteristic
f - fraction
hexadecimal floating-point

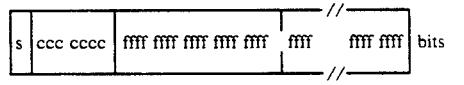

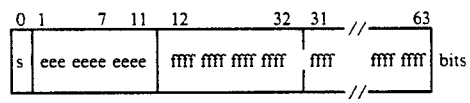

binary floating-point
s - sign
e - biased exponent
f - fraction

Normal range algorithm

| binary floating-point | |
|---|---|
| f: | fraction (bin) = fract(hex)/J1 |
| c: | exp (nin) = 4*(char(hex) − 64) + 1019 − J2 |
| | = 4*char(hex) + 763 − J2 |
| s: | sign (bin) = Sign (hex) |

Where J1 and J2 are both function of the 4 left-most bits of hex fraction.

Note: A loss of precision can occur if the least significant bits of the fraction are nonzero.

TABLE 12

| model | source default | destination default | ndx (21-44) | ndx (21-44) limits* |
|-------|----------------|---------------------|-------------|---------------------|
| maxx | 7FFF FFFF FFFF FFFF | 7FF0 1FC0 0000 0000 | | na |
| nix | $maxi < s \leq maxx$ | 7FF0 1FC0 0000 0000 | 21 | 7FFF FFFF FFFF FFFFF |
| | | | | — |
| | | | | 0000 0000 0000 0000 |
| maxi | 7FFF FFFE FFFF FFFF | 7FF0 0000 0000 0000 | 23 | $max < maxi < maxx$ |
| nin | $max < s \leq maxi$ | 7FF0 0000 0000 0000 | 25 | 7FFF FFFF FFFF FFFF |
| | | | | — |
| | | | | 0000 0000 0000 0000** |
| max | 7EFF FFFF FFFF FFFF | 4F6F FFFF FFFF FFFF | | na |
| normal | 7EFF FFFF FFFF FFFF | 4F6F FFFF FFFF FFFF | | na |
| | — | — | | |
| | 0010 0000 0000 0000 | 2FB0 0000 0000 0000 | | |
| min | 0010 0000 0000 0000 | 2FB0 0000 0000 0000 | | na |
| nzm | $minz \leq s < min$ | 0000 0000 0000 0000 | 29 | 0010 0000 0000 0000 |
| minz | 0010 0000 0000 0000 | 0000 0000 0000 0000 | 31 | 0010 0000 0000 0000 |
| nzz | $0 < s < minz$ | 0000 0000 0000 0000 | 33 | 0010 0000 0000 0000 |
| ±0 | 0000 0000 0000 0000 | 0000 0000 0000 0000 | | na |
| | 8000 0000 0000 0000 | 8000 0000 0000 0000 | | |

TABLE 12-continued

| model | source default | destination default | ndx (21–44) | ndx (21–44) limits* |
|---|---|---|---|---|
| inf | na | 0000 0000 0000 0000 | 35 | na |
| nan | na | 0000 0000 0000 0000 | 37 | na |
| nanu | unnormalized | 0000 0000 0000 0000 | 41 | 7FFF FFFF FFFF FFFF |
| | | | | — |
| | | | | 0000 0000 0000 0000 |
| nrd | | | 43 | 0000 0001 |
| | | | | — |
| | | | | 0000 0000 |

Note:
*na - not available for alternate definition
**warning provided if nin < max

TABLE 13

| model | source default | destination default | code A1 | ndx (3–15) counters* |
|---|---|---|---|---|
| maxx | 7FFF FFFF FFFF FFFF | 7FF0 1FC0 0000 0000 | 3 | 3,5 |
| nix | maxi<s≦maxx | 7FF0 1FC0 0000 0000 | 3 | 3,5 |
| maxi | 7FFF FFFE FFFF FFFF | 7F80 0000 0000 0000 | 5 | 5 |
| nin | max<s≦maxi | 7F80 0000 0000 0000 | 5 | 5 |
| max | 7EFF FFFF FFFF FFFF | 4F6F FFFF FFFF FFFF | | |
| normal | 7EFF FFFF FFFF FFFF | 4F6F FFFF FFFF FFFF | E** | 14** |
| | — | — | | |
| | 0010 0000 0000 0000 | 2FB0 0000 0000 0000 | | |
| min | 0010 0000 0000 0000 | 2FB0 0000 0000 0000 | | |
| nzm | minz≦s<min | 0000 0000 0000 0000 | 7 | 7 |
| minz | 0010 0000 0000 0000 | 0000 0000 0000 0000 | 7 | 7 |
| nzz | 0<s<minz | 0000 0000 0000 0000 | 9 | 7,9 |
| ±0 | 0000 0000 0000 0000 | 0000 0000 0000 0000 | | |
| | 8000 0000 0000 0000 | 8000 0000 0000 0000 | | |
| nanu | unnormalized characteristic = ones | 0000 0000 0000 0000 | D | 13 |

Note:
*all anomalies increment counter 15
**lost fraction bits (not recognized when ndx(43)=0)

When input argument errors are detected, no conversion occurs and ndx(1) is set to indicate one of the input argument error codes as follows:

- −2 ndx(2)≦0
- −9 ndx(1)<−8
- −10 knt≦0
- −20 ndx(20)≠check code
- −23 maxx=ndx(23) or ndx(23)≦max
- −43 1<ndx(43) or ndx(43)<0
- −44 ndx(44)≠check code
- −51 ndx(chk)≠check code,

BINARY FLOATING-POINT TO HEXADECIMAL FLOATING-POINT

Single/Short

BS2HS provides identity for crossreference
Convert binary single format real*4 numbers into hexadecimal short format real*4 numbers.

s - sign
e - biased exponent
f - fraction
binary floating-point

| s | eee eeee e | fff ffff ffff ffff ffff ffff | bits |

0 1    7 8 9                                  31

| s | ccc cccc | f fff ffff ffff ffff ffff ffff | bits | hexadecimal floating-point
s - sign
c - characteristic
f - fraction

Normal range algorithm

| hexadecimal floating-point | |
|---|---|
| f: | fraction(hex) = (00800000+ Mant (bin))/J1 |
| c: | Exp (hex) = (Exp (bin)−126+J2)/4 + 64 |
| | = (Exp (bin)+130+J2)/4 |
| s: | Sign (hex) = Sign (bin) |

Where J1 and J2 are both function of the 2 right-most bits of bin exponent.

Note: A loss of precision can occur if the least significant bits of the fraction are nonzero.

TABLE 14

| model | source default | destination default | ndx (21–44) | ndx (21–44) limits* |
|---|---|---|---|---|
| maxx | 7FFF FFFF | 7FFF FFFF | | na |
| nix | maxi<s≦maxx | 7FFF FFFF | 21 | na |
| maxi | 7F80 0000 | 7FFF FFF0 | 23 | na |
| nin | max<s≦maxi | 7FFF FFF0 | 25 | na |
| max | 7F7F FFFF | 60FF FFFF | | na |
| normal | 7F7F FFFF | 60FF FFFF | | na |
| | — | — | | |
| | 0000 0001 | 1B80 0000 | | |
| min | 0000 0001 | 1B80 0000 | | na |
| denorm | na | | na | na |
| mind | 0000 0001 | 1B80 0000 | 27 | na |
| mindt | 0000 0001 | 1B80 0000 | | na |
| nzm | minz≦s<mind | 0000 0000 | 29 | na |
| minz | 0000 0001 | 1B80 0000 | 31 | na |
| nzz | 0<s<minz | 0000 0000 | 33 | na |
| ±0 | 0000 0000 | 0000 0000 | | na |
| | 8000 0000 | 8000 0000 | | |
| inf | na | 7FFF FFF0 | 35 | 7FFF FFFF |
| | | | | — |
| | | | | 0000 0000 |

TABLE 14-continued

| model | source default | destination default | ndx (21–44) | ndx (21–44) limits* |
|---|---|---|---|---|
| nan | na | 7FFF FFFF | 37 | 7FFF FFFF |
|  |  |  |  | — |
|  |  |  |  | 0000 0000 |
| nanu | na | 0000 0000 | 41 | na |
| nrd |  | 43 | 0000 0001 |
|  |  |  |  | — |
|  |  |  |  | 0000 0000 |

Note:
*na - not available for alternate definition
**warnings provided if nin < max

TABLE 15

| model | source default | destination default | code A1 | ndx (3–15) counters* |
|---|---|---|---|---|
| max | 7F7F FFFF | 60FF FFFF |  |  |
| normal | 7F7F FFFF | 60FF FFFF | E** | 14** |
|  | 0000 0001 | 1B80 0000 |  |  |
| min | 0000 0001 | 1B80 0000 |  |  |
| ±0 | 0000 0000 | 0000 0000 |  |  |
|  | 8000 0000 | 8000 0000 |  |  |
| inf | 7F80 0000 | 7FFF FFF0 | A | 5,10 |
| nan | 7F8x xxxx | 7FFF FFFF | B | 5,11 |
|  | exponent = ones |  |  | 4 |

Note:
x nonzero
*all anomalies increment counter 15
**lost fraction bits (not recognized when ndx(43)=0)

When input argument errors are detected, no conversion occurs and ndx(1) is set to indicate one of the input argument error codes as follows:
- −2 ndx(2)≦0
- −9 ndx(1)< −8
- −10 knt≦0
- −20 ndx(20)≠check code
- −43 1 <ndx(43) or ndx(43)<0
- −44 ndx(44)≠check code
- −51 ndx(chk)≠check code,

Double/Long

BD2HL provides identity for crossreference
Convert binary double format real*8 numbers into hexadecimal long format real*8 numbers.

s - sign
e - biased exponent
f - fraction
binary floating-point

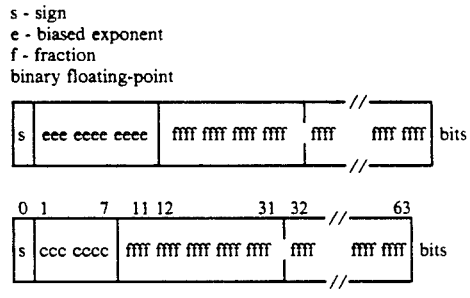

hexadecimal floating-point
s - sign
c - characteristic
f - fraction

Normal range algorithm

| hexadecimal floating-point | |
|---|---|
| f: | Mant (hex) = (00100000 + Mant (bin))*J1 |
| c: | Exp (hex) = (Exp (bin)−1019+J2)/4 + 64 = |
|  | = (Exp (bin)− 763+J2)/4 |
| s: | Sign (hex) = Sign (bin) |

Where J1 and J2 are both function of the 2 right-most bits of I3E exponent

Note: No precision is lost when source numbers are in normal range.

TABLE 16

| model | source default | destination default | ndx (21–44) | ndx (21–44) limits* |
|---|---|---|---|---|
| maxx | 7FFF FFFF FFFF FFFF | 7FFF FFFF 0000 0000 |  | na |
| nix | maxi<s≦maxx | 7FFF FFFF 0000 0000 | 21 | 7FFF FFFF FFFF FFFF |
|  |  |  |  | — |
|  |  |  |  | 0000 0000 0000 0000 |
| maxi | 7FF0 0000 0000 0000 | 7FFF FFF0 0000 0000 | 23 | max<maxi<maxx |
| nin | max<s≦maxi | 7FFF FFF0 0000 0000 | 25 | 7FFF FFFF FFFF FFFF |
|  |  |  |  | — |
|  |  |  |  | 0000 0000 0000 0000** |
| max | 4F6F FFFF FFFF FFFF | 7EFF FFFF FFFF FFFF |  | na |
| normal | 4F6F FFFF FFFF FFFF | 7EFF FFFF FFFF FFFF |  | na |
|  | 2FB0 0000 0000 0000 | 0010 0000 0000 0000 |  |  |
| min | 2FB0 0000 0000 0000 | 0010 0000 0000 0000 |  | na |
| denorm |  | na |  |  |
| mind | 2FB0 0000 0000 0000 | 0010 0000 0000 0000 | 27 | na |
| mindt | 2FB0 0000 0000 0000 | 0010 0000 0000 0000 | na | na |
| nzm | minz≦s<mind | 0000 0000 0000 0000 | 29 | 7FFF FFFF FFFF FFFF |
|  |  |  |  | — |
|  |  |  |  | 0000 0000 0000 0000** |
| minz | 0000 0000 0000 0001 | 0000 0000 0000 0000 | 31 | 7FFF FFFF FFFF FFFF |
|  |  |  |  | — |
|  |  |  |  | 0000 0000 0000 0000 |
| nzz | 0<s<minz | 0000 0000 0000 0000 | 33 | 7FFF FFFF FFFF FFFF |
|  |  |  |  | — |
|  |  |  |  | 0000 0000 0000 0000 |
| ±0 | 0000 0000 0000 0000 | 0000 0000 0000 0000 |  | na |
|  | 8000 0000 0000 0000 | 8000 0000 0000 0000 |  |  |
| inf | 7FF0 0000 0000 0000 | 7FFF FFF0 0000 0000 | 35 | 7FFF FFFF FFFF FFFF |
|  |  |  |  | — |
|  |  |  |  | 0000 0000 0000 0000 |
| nan | 7FFF FFFF FFFF FFFF | 7FFF FFFF 0000 0000 | 37 | 7FFF FFFF FFFF FFFF |
|  | 7FF0 0000 0000 0001 |  |  | 0000 0000 0000 0000 |

TABLE 16-continued

| model | source default | destination default | ndx (21–44) | ndx (21–44) limits* |
|---|---|---|---|---|
| nanu | unnormalized | 0000 0000 0000 0000 | 41 | na |
| nrd | | | 43 | na |

Note:
*na - not available for alternate definition
**warning provided if nin < max

TABLE 17

| model | source default | destination default | code A1 | ndx (3–15) counters* |
|---|---|---|---|---|
| maxx | 7FFF FFFF FFFF FFFF | 7FFF FFFF 0000 0000 | 3 | 3,5 |
| nix | maxi<s≦maxx | 7FFF FFFF 0000 0000 | 3 | 3,5 |
| maxi | 7FF0 0000 0000 0000 | 7FFF FFF0 0000 0000 | 5 | 5 |
| nin | max<s≦maxi | 7FFF FFF0 0000 0000 | 5 | 5 |
| max | 4F6F FFFF FFFF FFFF | 7EFF FFFF FFFF FFFF | | |
| normal | 4F6F FFFF FFFF FFFF | 7EFF FFFF FFFF FFFF | E | 14 |
| | — | — | | |
| | 2FB0 0000 0000 0000 | 0010 0000 0000 0000 | | |
| min | 2FB0 0000 0000 0000 | 0010 0000 0000 0000 | | |
| nzm | minz≦s<min | 0000 0000 0000 0000 | 7 | 7 |
| minz | 0000 0000 0000 0001 | 0000 0000 0000 0000 | 7 | 7 |
| nzz | 0<s<minz | 0000 0000 0000 0000 | 9 | 7,9 |
| ±0 | 0000 0000 0000 0000 | 0000 0000 0000 0000 | | |
| | 8000 0000 0000 0000 | 8000 0000 0000 0000 | | |
| inf | 7FF0 0000 0000 0000 | 7FFF FFF0 0000 0000 | A | 5,10 |
| nan | 7FFF FFFF FFFF FFFF | 7FFF FFFF 0000 0000 | B | 5,11 |
| | — | | | |
| | 7FF0 0000 0000 0001 | | | |
| | exponent = ones | | | 4 |

Note:
*all anomalies increment counter 15

When input argument errors are detected, no conversion occurs and ndx(1) is set to indicate one of the input argument error codes as follows:

−2 ndx(2)≦0
−9 ndx(1)<−8
−10 knt≦0
−20 ndx(20)≠check code
−23 maxx=ndx(23) or ndx(23)≦max
−31 ndx(27)≦ndx(31) or ndx(31)≦0
−44 ndx(44)≠check code
−51 ndx(chk)≠check code,

What is claimed is:

1. An apparatus for floating-point data conversion with provision for permitting improved accuracy recovery of an initial value without necessarily preserving an original value in original form comprising:

means responsive to first floating-point data of an initial value in a first floating-point format for converting said data to a second floating-point format according to given rules, means for detecting if in said conversion there is loss of an exact value in said second format due to lack of complete representation in said second format, means for generating reconstruction data in response to loss of said exact value in said second format, and means for storing said reconstruction data wherein said reconstruction data is available for use in correcting for loss of said exact value to thereby provide for recovery of an improved accuracy of the initial value.

2. The apparatus of claim 1 wherein said means for detecting detects a plurality of losses of said exact value and includes means for quantifying and accumulating a count of occurrences of said detected losses of said exact value recognized during a conversion cycle repetition sequence.

3. The apparatus of claim 1 wherein said means for converting further includes means for selecting alternative algorithms according to types of losses of said exact value.

4. The apparatus of claim 3 wherein there is further means for changing the algorithms used for said converting.

5. The apparatus of claim 1 wherein said first format is hexadecimal and said second format is binary.

6. The apparatus of claim 5 wherein said second format is IEEE binary format.

7. The apparatus of claim 1 wherein said first format is binary and said second format is hexadecimal.

8. The apparatus of claim 2 wherein said means for quantifying and accumulating further includes means for classifying by types of losses of said exact value.

9. The apparatus of claim 8 wherein said types of losses of said exact value include exact results due to excessive source, inexact results due to diminutive source and the source is infinity.

10. The apparatus of claim 8 wherein said types further include inexact results due to lost fractions and summaries.

11. The apparatus of claim 3 wherein said means for selecting further includes means for changing rules used for the selecting.

12. A method for floating-point data conversion with provision for permitting improved accuracy recovery of an initial value without necessarily preserving an original value in original form comprising the steps of:

converting a first floating-point data of an initial value in a first floating-point data format to a second floating-point data format according to given rules, detecting if in said conversion there is loss of an exact value in said second format due to lack of complete representation in said second format, generating reconstruction data in response to loss of said exact value, and storing said reconstruction data, wherein said reconstruction data is available for use in correcting for loss of said exact value to thereby provide for recovery of an improved accuracy of the initial value.

13. The method of claim 12 wherein the step of detecting includes the steps of quantifying and accumulating a count of detected occurrences of losses in exact values.

14. The method of claim 5 wherein the step of converting further includes selecting alternative algorithms by types of losses.

15. The method of claim 14 wherein said selecting further includes changing rules used for selecting.

16. The method of claim 14 further including changing the algorithms used for said converting.

* * * * *